United States Patent
Zaal et al.

(10) Patent No.: US 7,327,439 B2
(45) Date of Patent: Feb. 5, 2008

(54) LITHOGRAPHIC APPARATUS AND DEVICE MANUFACTURING METHOD

(75) Inventors: Koen Jacobus Johannes Maria Zaal, Eindhoven (NL); Joost Jeroen Ottens, Veldhoven (NL); Jan Hopman, Delft (NL)

(73) Assignee: ASML Netherlands B.V., Veldhoven (NL)

( * ) Notice: Subject to any disclaimer, the term of this patent is extended or adjusted under 35 U.S.C. 154(b) by 338 days.

(21) Appl. No.: 10/988,832

(22) Filed: Nov. 16, 2004

(65) Prior Publication Data

US 2006/0102277 A1 May 18, 2006

(51) Int. Cl.
  *G03B 27/62* (2006.01)
(52) U.S. Cl. .......................... 355/75; 355/72; 156/290
(58) Field of Classification Search ................. 355/72, 355/75
  See application file for complete search history.

(56) References Cited

U.S. PATENT DOCUMENTS 5,600,530 A * 2/1997 Smith .......................... 361/234
6,803,780 B2 * 10/2004 Adams et al. ............... 324/755

FOREIGN PATENT DOCUMENTS

EP  0 947 884 B1  3/2004

* cited by examiner

*Primary Examiner*—D. Rutledge
(74) *Attorney, Agent, or Firm*—Pillsbury Winthrop Shaw Pittman LLP

(57) ABSTRACT

A lithographic apparatus is disclosed. The apparatus includes an illumination system arranged to condition a radiation beam, and an article support configured to support an article to be placed in a beam path of the radiation beam. The article support includes a plurality of bonded layers. At least one of the bonded layers includes a plurality of recesses facing another of the bonded layers, so as to reduce a bonding surface between the bonded layers.

35 Claims, 7 Drawing Sheets

LITHOGRAPHIC APPARATUS AND DEVICE MANUFACTURING METHOD

FIELD

The present invention relates to a lithographic apparatus and a method for manufacturing a device.

BACKGROUND

A lithographic apparatus is a machine that applies a desired pattern onto a substrate, usually onto a target portion of the substrate. A lithographic apparatus can be used, for example, in the manufacture of integrated circuits (ICs). In that instance, a patterning device, which is alternatively referred to as a mask or a reticle, may be used to generate a circuit pattern to be formed on an individual layer of the IC. This pattern can be transferred onto a target portion (e.g. including part of, one, or several dies) on a substrate (e.g. a silicon wafer). Transfer of the pattern is typically via imaging onto a layer of radiation-sensitive material (resist) provided on the substrate. In general, a single substrate will contain a network of adjacent target portions that are successively patterned. Known lithographic apparatus include so-called steppers, in which each target portion is irradiated by exposing an entire pattern onto the target portion at one time, and so-called scanners, in which each target portion is irradiated by scanning the pattern through a radiation beam in a given direction (the "scanning"-direction) while synchronously scanning the substrate parallel or anti-parallel to this direction. It is also possible to transfer the pattern from the patterning device to the substrate by imprinting the pattern onto the substrate.

In the lithographic apparatus as hereabove specified, an article to be placed in the radiation beam is held to an article support, for example, by a clamping electrode by vacuum suction or otherwise. Electrostatic clamping may be used, for example, when a substrate is processed in vacuum conditions. This type of processing occurs, for example, when the type of irradiation used for photolithographic processes is in the (soft) x-ray region, also referred to as Extreme Ultraviolet (EUV) region. In current designs for wafer tables, wafer holders are often arranged in the form of a multilayer structure. Especially for electrostatic clamp designs, electrodes are buried in the structure so that a typical article support member set up is a thicker stabilizing layer of a rigid material, such as ZERODUR® glass ceramic material, a metal layer forming an electrode layer, and a top layer covering the electrode. Electrostatic clamping uses electrostatic attraction force as clamping force, which is typically dependent on a voltage difference and a clamping distance between the electrode and the wafer. In order to achieve good clamping, the applied voltage difference is high and the distance is small.

It has been found beneficial to reduce the distance in order to prevent excessive voltage differences, which may cause problems, such as breakthrough, etc.

A tendency exists to minimize the thickness of the covering layer. However, the covering layer that is applied on the electrode is often another rigid layer of a dielectric material, which may also have a specific structure of protrusions in order to minimize a surface for contacting the wafer. Thus, the covering layer may be very thin and, therefore, fragile in handling. Specifically, it has been found that the current thicknesses are often very vulnerable to contamination when the layers are bonded, because the contamination that is entrapped may amount to local stress in the top layer. This results in a top layer that is easily corrupted, and may cause, in the case of electrostatic clamping, occurrences of breakthrough. Otherwise, such contamination may destroy the flatness properties of the article support member, thereby causing undesired loss of resolution.

In the context of this application, the "article" may be any of the above-mentioned terms wafer, reticle, mask, or substrate, more specifically, terms such as a substrate to be processed in manufacturing devices employing lithographic projection techniques, or a lithographic projection mask or mask blank in a lithographic projection apparatus, a mask handling apparatus such as mask inspection or cleaning apparatus, or a mask manufacturing apparatus, or any other article or optical element that is clamped in the light path of the radiation system.

SUMMARY

One aspect of the present invention is to provide a lithographic apparatus that includes an article support member that is more robust, and less sensitive to the presence of contamination during the manufacturing process thereof.

Another aspect of the present invention is to provide a more robust article support member that is less sensitive to the above-mentioned circumstances, and that has increased flatness for obviating the presence of contamination during the manufacturing process.

Another aspect of the present invention is to provide a manufacturing process for manufacturing a multilayer structure that is less vulnerable to the presence of contaminations.

The invention relates to a lithographic apparatus that includes an article support member that is configured to support an article to be placed in a beam path of radiation of the lithographic apparatus, and to a method for manufacturing thin laminated structures, in particular, a method for manufacturing an article support member for a lithographic apparatus.

According to an embodiment of the invention, there is provided a lithographic apparatus that includes an illumination system arranged to condition a radiation beam, and an article support configured to support an article to be placed in a beam path of the radiation beam. The article support includes a plurality of bonded layers. At least one of the bonded layers includes a plurality of recesses facing another of the bonded layers, so as to reduce a bonding surface between the bonded layers.

According to an embodiment of the invention, there is provided a lithographic apparatus that includes an illumination system arranged to provide a radiation beam, and an article support member configured to support an article to be placed in a beam path of the radiation beam on the article support. The article support member includes a plurality of bonded layers. At least one of the bonded layers includes a plurality of recesses facing another of the plurality of bonded layers, so as to reduce a bonding surface between the bonded layers. In particular, according to the invention, contaminations that may be present during manufacturing are encapsulated in the recesses, so that the bonding surface remains free from unwanted particles. Thus, the bonding surface remains flat and the risk of occurrence of fractions in the bonded layer is reduced, improving the overall flatness of the article support member.

In an embodiment of the invention, there is provided an article support configured to support an article to be placed in a beam path of radiation of a lithographic apparatus. The article support includes a plurality of bonded layers. One of the bonded layers includes a plurality of recesses facing another of the bonded layers, so as to reduce a bonding surface between the bonded layers.

In an embodiment of the invention, there is provided a method of bonding objects of a rigid material for use in a lithographic apparatus. The method includes providing a first object of a rigid material that includes a first face side, providing a second object of a rigid material that includes a second face side, creating a layout of recesses on at least the second face side of the second object, so as to reduce a contact between the bonding surfaces, and bonding the first and the second objects by bonding the first and second face sides.

In an embodiment of the invention, there is provided a bonding structure of bonded rigid materials for use in a lithographic apparatus. The bonding structure includes a first object of a rigid material that includes a first face side, and a second object of a rigid material that includes a second face side. The second face side includes protrusions formed thereon that face the first face side. The bonding structure also includes a bonding material that bonds the first and second face sides.

In an embodiment of the invention, there is provided a device manufacturing method. The method includes generating a radiation beam, supporting an article in a beam path of the radiation beam with an article support, patterning the radiation beam, and projecting the patterned radiation beam onto a target portion of a substrate. The article support includes a plurality of bonded layers. One of the bonded layers includes a plurality of recesses facing another of the bonded layers, so as to reduce a bonding surface between the bonded layers.

In an embodiment of the invention, a device that have been manufacturing according to the aforementioned device manufacturing method is provided.

BRIEF DESCRIPTION OF THE DRAWINGS

Embodiments of the invention will now be described, by way of example only, with reference to the accompanying schematic drawings, in which corresponding reference symbols indicate corresponding parts, and in which.

DETAILED DESCRIPTION

Figure 1:
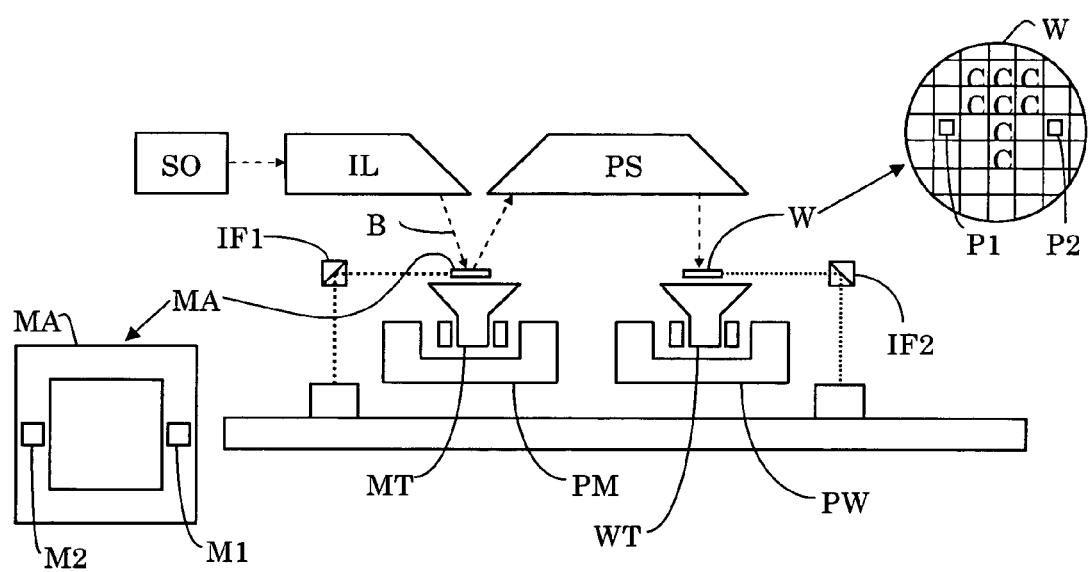
FIG. 1 depicts a lithographic apparatus according to an embodiment of the invention.

FIG. 1 schematically depicts a lithographic apparatus according to an embodiment of the invention. The apparatus includes an illumination system (illuminator) IL configured to condition a radiation beam B (e.g. UV radiation or EUV radiation), a support structure (e.g. a mask table) MT constructed to support a patterning device (e.g. a mask) MA and connected to a first positioner PM configured to accurately position the patterning device in accordance with certain parameters, a substrate table (e.g. a wafer table) WT constructed to hold a substrate (e.g. a resist-coated wafer) W and connected to a second positioner PW configured to accurately position the substrate in accordance with certain parameters, and a projection system (e.g. a refractive projection lens system) PS configured to project a pattern imparted to the radiation beam B by patterning device MA onto a target portion C (e.g. including one or more dies) of the substrate W.

The illumination system may include various types of optical components, such as refractive, reflective, magnetic, electromagnetic, electrostatic, or other types of optical components, or any combination thereof, for directing, shaping, or controlling radiation.

The support structure MT supports, i.e. bears the weight of, the patterning device MA. It holds the patterning device in a manner that depends on the orientation of the patterning device, the design of the lithographic apparatus, and other conditions, such as, for example, whether or not the patterning device is held in a vacuum environment. The support structure MT may use mechanical, vacuum, electrostatic, or other clamping techniques to hold the patterning device MA. The support structure may be a frame or a table, for example, which may be fixed or movable as required. The support structure MT may ensure that the patterning device MA is at a desired position, for example, with respect to the projection system PS. Any use of the terms "reticle" or "mask" herein may be considered synonymous with the more general term "patterning device."

The term "patterning device" as used herein should be broadly interpreted as referring to any device that can be used to impart a radiation beam with a pattern in its cross-section so as to create a pattern in a target portion of the substrate. It should be noted that the pattern imparted to the radiation beam may not exactly correspond to the desired pattern in the target portion of the substrate, for example, if the pattern includes phase-shifting features, or so-called assist features. Generally, the pattern imparted to the radiation beam will correspond to a particular functional layer in a device being created in the target portion, such as an integrated circuit.

The patterning device may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam which is reflected by the mirror matrix.

The term "projection system" as used herein should be broadly interpreted as encompassing any type of projection system, including refractive, reflective, catadioptric, magnetic, electromagnetic, and electrostatic optical systems, or any combination thereof, as appropriate, for the exposure radiation being used, or for other factors such as the use of an immersion liquid or the use of a vacuum. Any use of the term "projection lens" herein may be considered as synonymous with the more general term "projection system".

As here depicted, the apparatus is of a reflective type (e.g. employing a reflective mask). Alternatively, the apparatus may be of a transmissive type (e.g. employing a transmissive mask).

The lithographic apparatus may be of a type having two (dual stage) or more substrate tables (and/or two or more mask tables). In such "multiple stage" machines, the additional tables may be used in parallel, or preparatory steps may be carried out on one or more tables, while one or more other tables are being used for exposure.

The lithographic apparatus may also be of a type in which at least a portion of the substrate may be covered by a liquid having a relatively high refractive index, e.g. water, so as to fill a space between the projection system and the substrate. An immersion liquid may also be applied to other spaces in the lithographic apparatus, for example, between the mask and the projection system. Immersion techniques are well known in the art for increasing the numerical aperture of projection systems. The term "immersion" as used herein does not mean that a structure, such as a substrate, must be submerged in liquid, but rather only means that liquid is located between the projection system and the substrate during exposure.

Referring to FIG. 1, the illuminator IL receives a radiation beam from a radiation source SO. The source and the lithographic apparatus may be separate entities, for example when the source is an excimer laser. In such cases, the source is not considered to form part of the lithographic apparatus, and the radiation beam is passed from the source SO to the illuminator IL with the aid of a beam delivery system including, for example, suitable directing mirrors and/or a beam expander. In other cases, the source may be an integral part of the lithographic apparatus, for example, when the source is a mercury lamp. The source SO and the illuminator IL, together with the beam delivery system, if required, may be referred to as a radiation system.

The illuminator IL may include an adjuster for adjusting the angular intensity distribution of the radiation beam. Generally, at least the outer and/or inner radial extent (commonly referred to as σ-outer and σ-inner, respectively) of the intensity distribution in a pupil plane of the illuminator can be adjusted. In addition, the illuminator IL may include various other components, such as an integrator and a condenser. The illuminator may be used to condition the radiation beam, to have a desired uniformity and intensity distribution in its cross-section.

The radiation beam B is incident on the patterning device (e.g., mask MA), which is held on the support structure (e.g., mask table MT), and is patterned by the patterning device. Having traversed the mask MA, the radiation beam B passes through the projection system PS, which focuses the beam onto a target portion C of the substrate W. With the aid of the second positioner PW and position sensor IF2 (e.g. an interferometric device, linear encoder or capacitive sensor), the substrate table WT can be moved accurately, so as to position different target portions C in the path of the radiation beam B. Similarly, the first positioner PM and another position sensor IF1 can be used to accurately position the mask MA with respect to the path of the radiation beam B, e.g. after mechanical retrieval from a mask library, or during a scan. In general, movement of the mask table MT may be realized with the aid of a long-stroke module (coarse positioning) and a short-stroke module (fine positioning), which form part of the first positioner PM. Similarly, movement of the substrate table WT may be realized using a long-stroke module and a short-stroke module, which form part of the second positioner PW. In the case of a stepper (as opposed to a scanner), the mask table MT may be connected to a short-stroke actuator only, or may be fixed. Mask MA and substrate W may be aligned using mask alignment marks M1, M2 and substrate alignment marks P1, P2. Although the substrate alignment marks, as illustrated, occupy dedicated target portions, they may be located in spaces between target portions (these are known as scribe-lane alignment marks). Similarly, in situations in which more than one die is provided on the mask MA, the mask alignment marks may be located between the dies.

The depicted apparatus could be used in at least one of the following example modes:

1. In step mode, the mask table MT and the substrate table WT are kept essentially stationary, while an entire pattern imparted to the radiation beam is projected onto a target portion C at one time (i.e. a single static exposure). The substrate table WT is then shifted in the X and/or Y direction so that a different target portion C can be exposed. In step mode, the maximum size of the exposure field limits the size of the target portion C imaged in a single static exposure.

2. In scan mode, the mask table MT and the substrate table WT are scanned synchronously while a pattern imparted to the radiation beam is projected onto a target portion C (i.e. a single dynamic exposure). The velocity and direction of the substrate table WT relative to the mask table MT may be determined by the (de-)magnification and image reversal characteristics of the projection system PS. In scan mode, the maximum size of the exposure field limits the width (in the non-scanning direction) of the target portion in a single dynamic exposure, whereas the length of the scanning motion determines the height (in the scanning direction) of the target portion.

3. In another mode, the mask table MT is kept essentially stationary holding a programmable patterning device, and the substrate table WT is moved or scanned while a pattern imparted to the radiation beam is projected onto a target portion C. In this mode, generally a pulsed radiation source is employed and the programmable patterning device is updated as required after each movement of the substrate table WT or in between successive radiation pulses during a scan. This mode of operation can be readily applied to maskless lithography that utilizes programmable patterning device, such as a programmable mirror array of a type as referred to above.

Combinations and/or variations on the above described modes of use or entirely different modes of use may also be employed.

Designing article supports such as wafer tables or reticle supports in a lithographic system, is a challenging process. In the remaining discussion, the embodiments may be referred to as wafer tables, although it has to be understood that these embodiments may also be referred to as the more general indication of "article supports" or "article support members". Specifically, in the context of this invention, the article supports may form any support for placing an article in a beam of radiation, be it a wafer, a mask, or a fiducial reticle.

Figure 2:
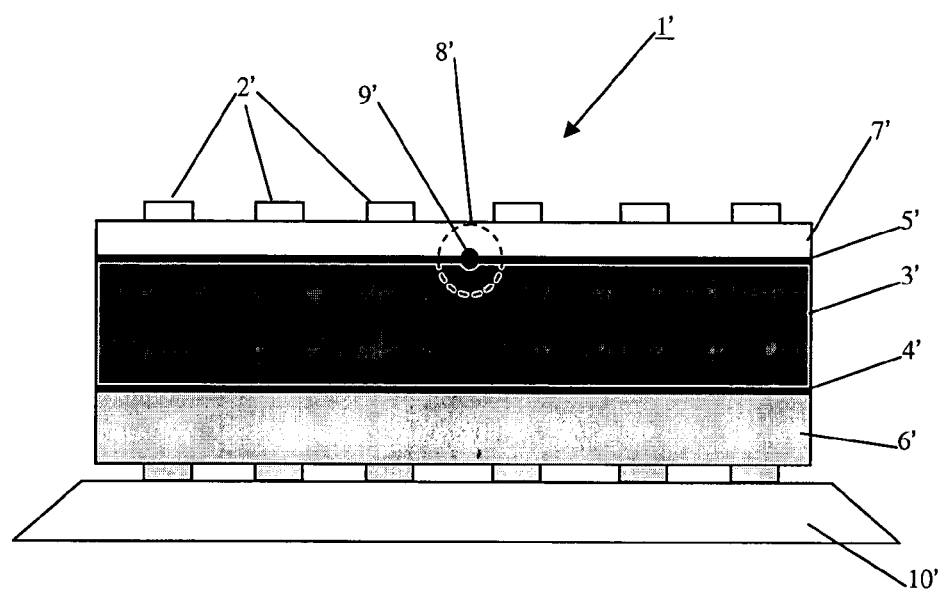
FIG. 2 depicts a prior art article holder.

Conventionally, the wafer table is provided with protrusions that are arranged to improve the flatness of the substrate. A conventional wafer table 1' is depicted in FIG. 2, and is described by European patent application EP0947884, which is incorporated herein by reference in its entirety. On the wafer table 1', protrusions 2' are arranged to improve the flatness of the substrate. These protrusions 2' have a general diameter of 0.5 mm, and are located generally at a distance of 3 mm away from each other, and thereby form a bed of supporting members that support the substrate. For an electrostatic clamp as illustrated, typically, the height of the protrusions lies in the range 1 µm-15 µm. In other arrangements, the wafer table may provide clamping by providing a vacuum pressure on the backside of an article (known as vacuum clamping). For this type of article support members, these protrusions generally have a height of 100 μm. Due to the relative large spaces in between the protrusions, contamination possibly present generally does not form an obstruction for the flatness of the substrate, because the contamination will be lying in between the protrusions, and will not lift the substrate locally. Often, as shown in the FIG. 2 prior art embodiment, the electrostatic clamp is a few millimeters in thickness, and includes a plurality of bonded layers, for example, a thicker layer 3' covered with electrode layers 4, 5. The electrode layers 4', 5' are covered with thin dielectric layers 6', 7' for shielding the electrodes 4', 5' from the environment. The layers are chosen from a variety of rigid materials, for example, materials known in the art as ULE®, ZERODUR®, Cordierite or Sapphire material, or other rigid materials, such as ceramic materials or crystalline materials. These materials may be chosen, among others, for good mechanical stability and heat conductivity, and reduced thermal expansion properties. As schematically indicated by 8' in FIG. 2, during manufacture, the presence of inclusions 9' may create a problem. Even where initially the top layer 7' has a certain dimensional stability (typically in the order of a millimeter), during the manufacture, the top layer 7' is considerably reduced in thickness, until a final thickness of about 100 μm is reached. On top of the layer 7', a layout of protrusions, or burls, 2' is provided, which may be achieved by mechanical or etching processes known in the art. However, due to the presence of these inclusions 9', which may also be gaseous inclusions 9', the top layer 7', in particular, the area 8', may be put under considerable stress and may even crack or break in the area 8'. It is evident that this will impact the performance of the article support member 1', because the electrode 5' may become exposed, or the flatness properties of the wafer table may be affected.

The same may hold true for the bottom layer 6', which shields the lower electrode 4' from the environment. The lower electrode 4' is typically used for clamping the wafer table against a base plate 10', thus forming a tight mechanical connection between the clamped wafer (not shown), the clamped wafer table 1' and the base, which in the art is known as the "chuck", that is moved in order to provide a scanning movement of the wafer. Also here, the presence of particles or inclusions 9' during bonding of the layers may result in unflatness or damage to the article support member 1'.

Figure 3:
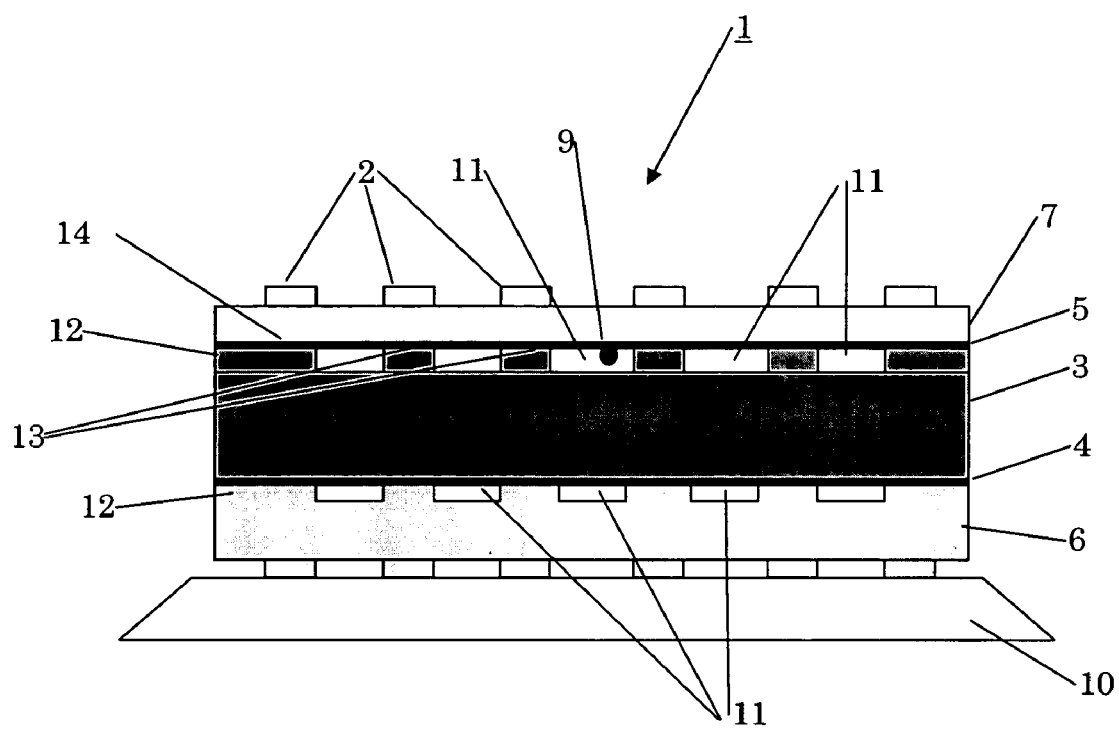
FIG. 3 depicts an article holder of the lithographic apparatus of FIG. 1, according to and embodiment of the invention.

FIG. 3 shows the wafer table 1 according to the invention. Here, the particles 9 are encapsulated in the recesses 11 formed by an internal burl structure 12 that is provided on the central layer 3. In this way, the bonding surface 13 between the layer 3 and layer 7 remains free from unwanted particles. It is to be understood that the bonding surface 13 is formed by the top surface of the internal burl structure 12. Thus, the bonding surface 13 remains flat and the risk of occurrence of fractions in the layer 7 is reduced, thereby improving the overall flatness of the article support member 1.

According to the inventive embodiment depicted in FIG. 3, the internal burl structure 12 is provided on the central layer 3 and forms a plurality of recesses 11 in the layer 3 facing the dielectric layer 7. A lower face side 14 of the dielectric layer 7 facing the burl structure 12 is covered with a metallic layer, in particular an aluminum layer that is damped on the dielectric layer 7. The aluminum layer forms electrode layer 5. The lower face side 14 forms a contact surface contacting the top surface of the internal burl structure 12.

Thus, the electrode layer 4 forms a bonding layer, bonding the dielectric layer 7 to the central layer 3. Since the bonding layer 4 is only brought in contact with the top surface of the internal burl structure 12, this may result in a reduced contact area of, for example, only 0.1-10% of the area of layer 3. The chances of a particle inclusion causing surface unflatness is thus considerably reduced. Moreover, the burl structure 12 prevents the inclusion gas since the structure may be held in open communication with the environment, and the gas cannot be trapped during bonding of the layers 3 and 5. This bonding is preferably performed by anodic bonding, as will be further explained below.

Figure 4:
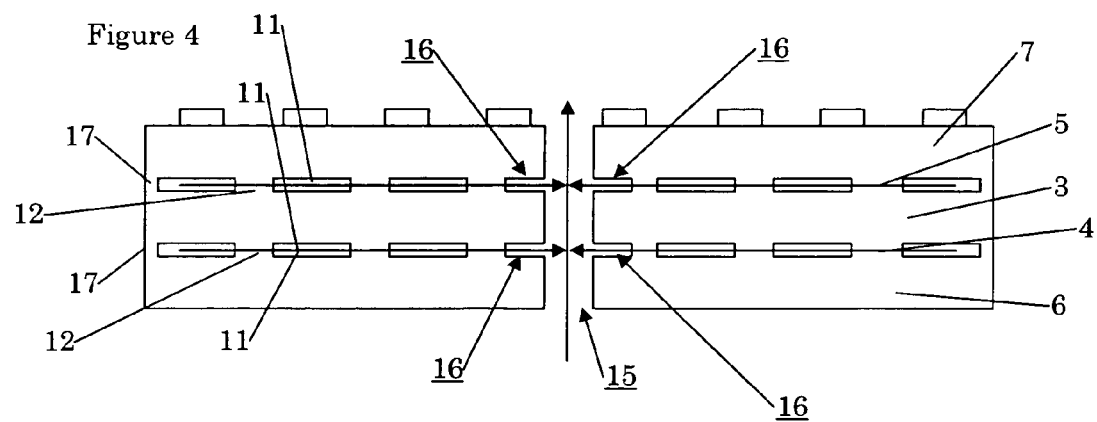
FIG. 4 depicts an embodiment of the article holder according to the invention.

FIG. 4 shows a first embodiment of an internal burl structure layout 12 for a wafer table 1. The wafer table 1 is similar to the embodiment depicted in FIG. 3, that is, the wafer table includes a structure of three layers 3, 6, 7 bonded by two bonding layers 4, 5. The bonding layers 4, 5 function as electrodes so as to form an electrostatically clamped wafer table 1. For a typical electrostatically clamped wafer table 1, a backfill gas structure is present, that is depicted as a central backfill gas channel 15. This channel 15 transports backfill gas to and from a backside of the wafer (not shown) that is clamped on top of the protrusions 2. Thus, the space between the protrusions 2 is filled by the backfill gas in order to promote thermal conductivity for conducting heat from the wafer to the wafer table 1. According to the invention, the backfill gas structure is in communication with drains 16 of the internal burl structure 12 to level the pressure in the recesses 11 with the backfill gas pressure level. In this embodiment, the internal burl structure layout is sealed from the vacuum environment by a seal 17 to prevent backfill gas from entering the ambient environment, which is kept at vacuum pressure level.

Figure 5:
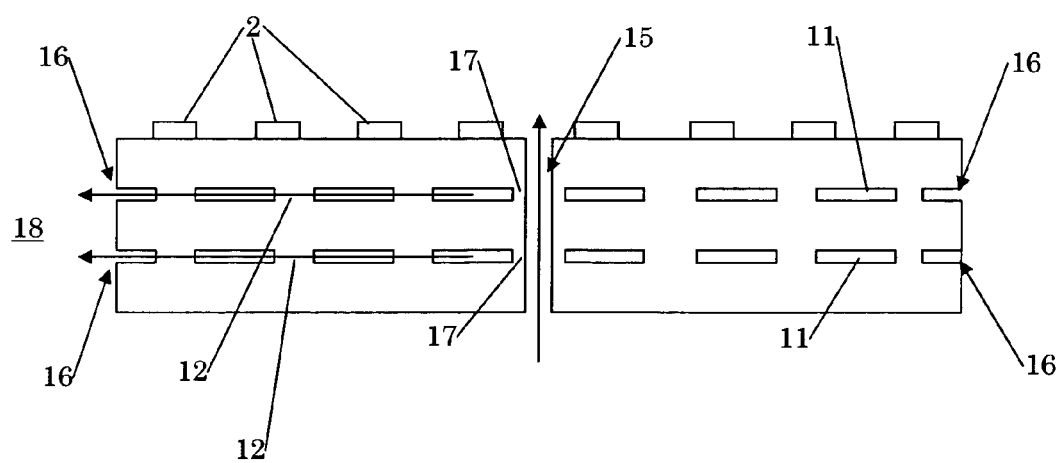
FIG. 5 depicts an embodiment of an article holder according to the invention.

FIG. 5 shows another embodiment that is an alternative to the embodiment depicted in FIG. 4. Here, the recesses 11 are separated from the backfill gas channel 15 and drain in the environment 18 which, in case of an EUV vacuum clamping arrangement, brings on vacuum pressure. Because the internal structure 12 is in direct contact with the environment 18, the recesses 11 of wafer table 1 are exhausted during startup of the lithographic process, where the processing environment 18 is brought in a vacuum pressure condition. Since the recesses 11 are physically sealed from the backfill gas channel 15, leakage of backfill gas via the internal burl structure 12 may be prevented.

Alternatively to the FIG. 4 and FIG. 5 embodiments, the internal structure may be sealed completely, or may be drained with a drain other than the backfill gas structure or vacuum pressure environment.

Figure 6:
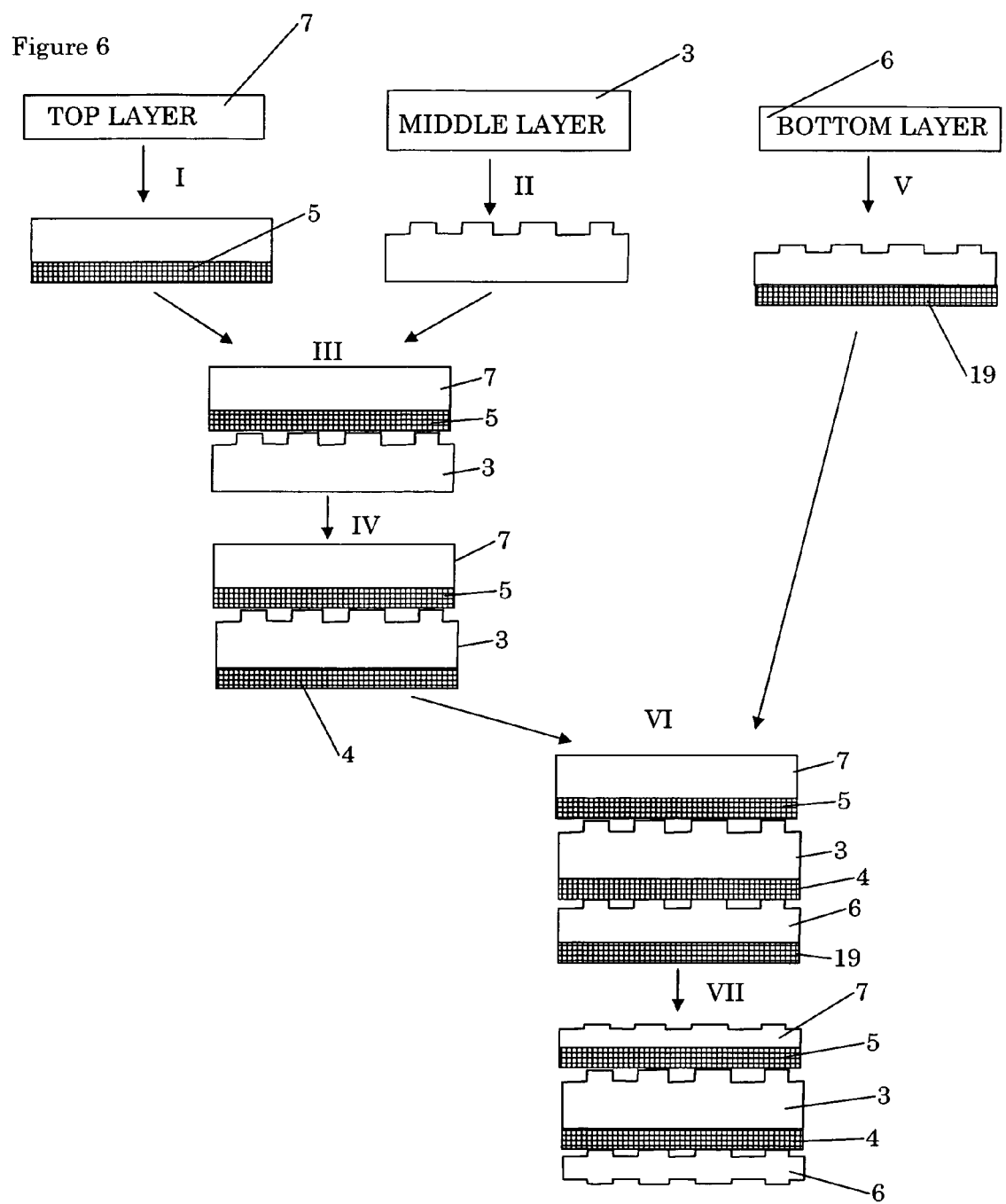
FIG. 6 shows schematically the steps for manufacturing a multilayered structure according to the invention.

FIG. 6 illustrates schematically the actions for manufacturing a multilayer structure according to the invention. Specifically, an article support member 1 that includes a lower 4 and an upper electrode 5 for clamping the article support member 1 to a base (not illustrated), and for clamping an article (not illustrated), such as a wafer, a reticle or the like, to the article support member 1. Although in the description, the actions are numbered in consecutive order, it will be understood that some of the actions may be carried out in parallel or in reverse order.

First, in action I, on a top rigid layer 7, specifically, an ULE layer, a metallic layer (preferably aluminum) is applied, for forming a top electrode layer 5 covered by the ULE layer 7.

In action II, a middle rigid layer 3 of, for example, ZERODUR® glass ceramic material is treated by known methods to form a burl structure thereon. As an example, the burls have general diameter of 0.5 mm and are located generally at a distance of 3 mm away from each other, and thereby form a bed of supporting members that support the substrate. The burls may have a height of 1-100 µm.

According to the invention, in action III, the top layer 7 is brought into contact with the middle layer 3, where the bonding surface formed by electrode layer 5 is reduced by the presence of the recesses 11 formed by the internal burl structure 12. The bonding is typically performed by anodic bonding, where the anode is formed by the aluminum layer, and a cathode is formed by a layer of silver (not shown) that is applied to the bottom of rigid layer 3.

Next, in action IV, the silver layer is removed and another aluminum layer is formed on the bottom surface of the central layer 3, to form a second lower electrode 4 for clamping the article support member to a base. Next, a repetition of the steps is applied similar to actions I-III for the lower electrode.

Specifically, in action V, a bottom layer 6 of, for example, ZERODUR® is treated to form an internal burl structure, to be brought in contact with the lower electrode aluminum layer 4. Furthermore, a conductive material 19 is temporarily applied to the bottom layer 6, for example, silver paint, to form a cathode. Then, in an anodic bonding process in which the lower electrode 4 is used as an anode, and the temporary layer 19 as a cathode, the layers 3 and 6 are fused together via bonding layer 4.

Finally, in actions VI and VII, the temporary conductive layer 19 is removed, and external burl structures are provided on the lower and top layers 6 and 7 to provide a flat clamping surface for the article to be clamped.

Figure 7:
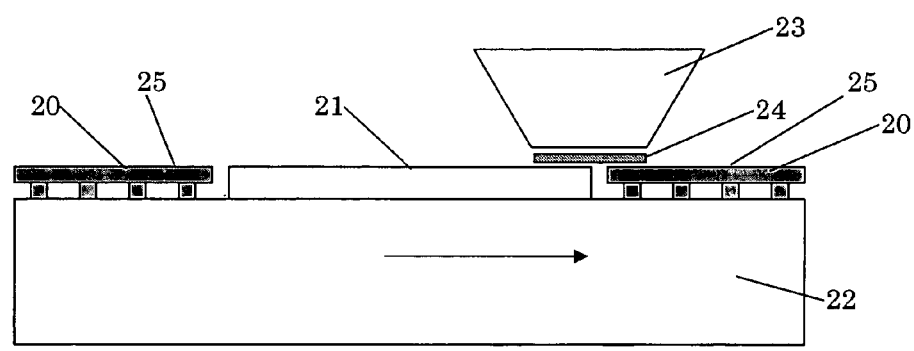
FIG. 7-FIG. 10 show further examples of embodiments including a bonded structure according to the invention.

FIG. 7-FIG. 10 show various embodiments illustrating the inventive concepts in a range of applications, including the inventive multilayer structure. In particular, FIG. 7 shows a filler plate structure 20 for housing a substrate 21 in an immersion photolithographic apparatus. That is, for immersion lithography, a substrate 21 may be moved by a positioning device 22 below a projection system 23, while keeping a liquid film 24 located between the projection system and the substrate 21 during exposure. To fully cover the substrate 21 by the projection system, a filler plate 20 is provided to provide excess room for providing the liquid film also near the boundary of the substrate 21. The filler plate structure 20 is conveniently bonded to the top surface of the positioning device 20. Through the internal burl structure, the top surface 25 is kept flat without disturbances caused by contaminants entrapped by the filler plate 20 while bonded to the positioning device 22.

Figure 8:
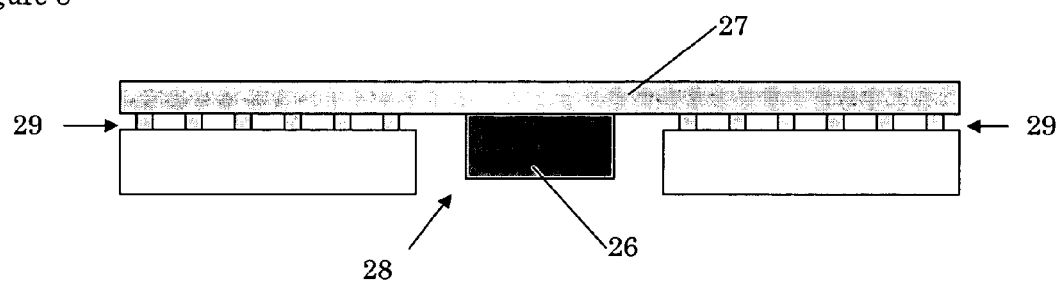

FIG. 8 shows a further embodiment of the present invention. In this embodiment, a sensor element 26 is suspended from a covering plate 27, and exposed to electromagnetic radiation. The suspension configuration 28 is carried out with the inventive internal burl structure 29. Using this configuration 28, a suspension is provided without creating the need of providing a recess in the suspension material. Instead, a perfectly alignable sensor 26 may be provided. By using this embodiment.

Figure 9:
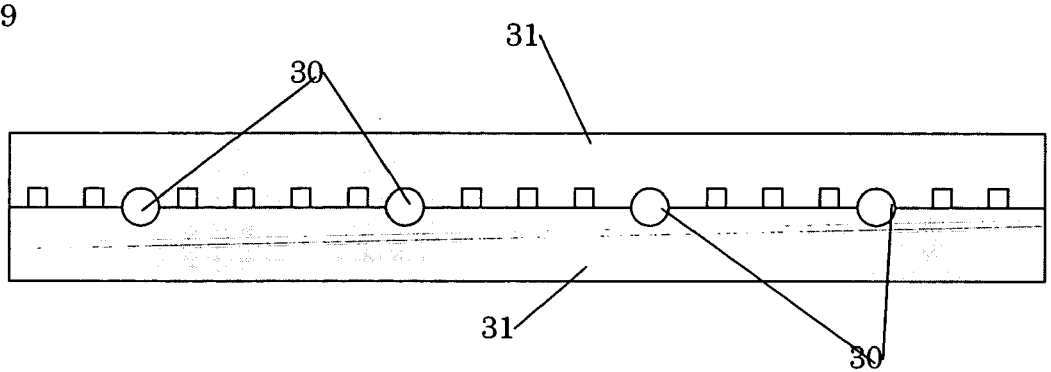

FIG. 9 shows still a further embodiment of the present invention. Here, a duct structure 30 is provided in an article support as illustrated in FIG. 2. The duct structure 30 may be internal in a central layer of the article support, and may be used for cooling purposes to provide a thermally stable article support member. The embodiment provides a way of precisely aligning and bonding thin laminar elements 31, without compromise by contaminants trapped in between the elements 31.

Figure 10:
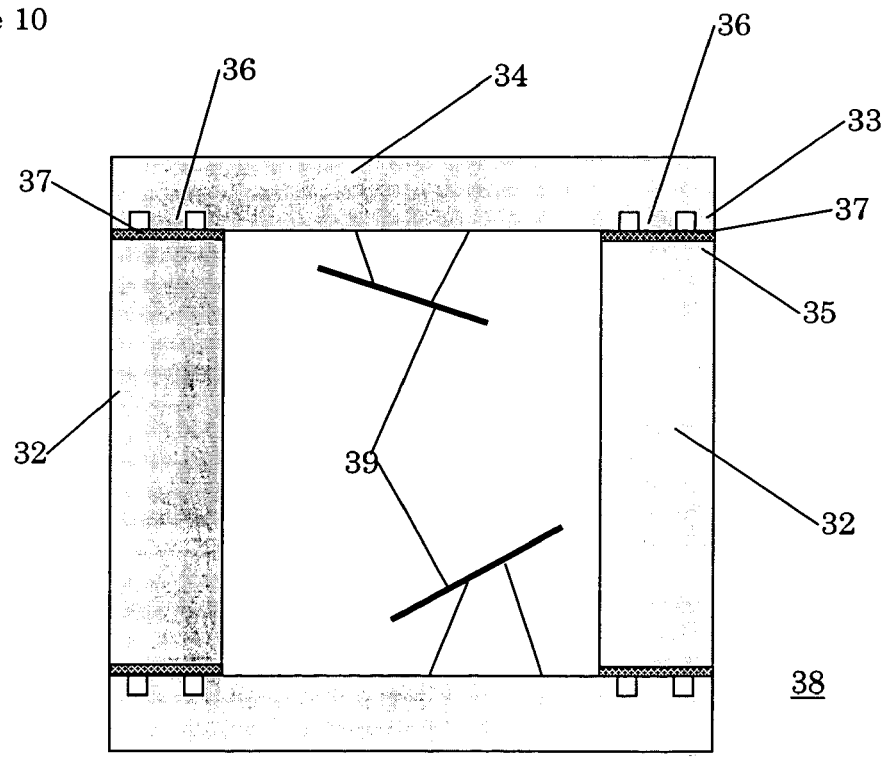

FIG. 10 shows a still further embodiment provided with the inventive internal burl structure. Here, a bonding structure is provided for bonding rigid columns 32, that include a first column 32 that includes a first face side 33, a second column 34 that includes a second face side 35, the second face side 35 having protrusions 36 formed thereon facing the first face side 33, and a bonding layer 37 bonding the first and second face sides 33, 35. Preferably, the bonding layer includes an aluminum material. The columns 32, 34 are provided by a rigid material such as ceramic material or ULE®, ZERODUR®, Cordierite, or Sapphire material. This bonding arrangement may be beneficial in providing a fine positioned framework 38 for aligning mirrors 39, or the like.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, liquid-crystal displays (LCDs), thin-film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in, for example, a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example, in order to create a multi-layer IC, so that the term substrate used herein may also refer to a substrate that already contains multiple processed layers.

Although specific reference may have been made above to the use of embodiments of the invention in the context of optical lithography, it will be appreciated that the invention may be used in other applications, for example, imprint lithography, and where the context allows, is not limited to optical lithography. In imprint lithography, a topography in a patterning device defines the pattern created on a substrate. The topography of the patterning device may be pressed into a layer of resist supplied to the substrate, whereupon the resist is cured by applying electromagnetic radiation, heat, pressure, or a combination thereof. The patterning device is moved out of the resist leaving a pattern in it after the resist is cured.

The terms "radiation" and "beam" as used herein encompass all types of electromagnetic radiation, including ultraviolet (UV) radiation (e.g. having a wavelength of or about 365, 355, 248, 193, 157 or 126 nm) and extreme ultra-violet (EUV) radiation (e.g. having a wavelength in the range of 5-20 nm), as well as particle beams, such as ion beams or electron beams.

The term "lens", where the context allows, may refer to any one or combination of various types of optical components, including refractive, reflective, magnetic, electromagnetic and electrostatic optical components.

While specific embodiments of the invention have been described above, it will be appreciated that the invention may be practiced otherwise than as described. For example, the invention may take the form of a computer program containing one or more sequences of machine-readable instructions describing a method as disclosed above, or a data storage medium (e.g. semiconductor memory, magnetic or optical disk) having such a computer program stored therein.

The descriptions above are intended to be illustrative, not limiting. Thus, it will be apparent to one skilled in the art that modifications may be made to the invention as described without departing from the scope of the claims set out below.

What is claimed is:

1. A lithographic apparatus comprising:
an illumination system arranged to condition a radiation beam; and
an article support configured to support an article to be placed in a beam path of said radiation beam, said article support comprising a plurality of bonded layers, wherein at least one of said bonded layers comprises a plurality of recesses facing another of said bonded layers so as to reduce a bonding surface therebetween.

2. A lithographic apparatus according to claim 1, wherein a first one of said bonded layers comprises a plurality of protrusions forming said recesses, facing a second one of said bonded layers, and wherein said first and said second bonded layers are bonded by a bonding layer.

3. A lithographic apparatus according to claim 2, wherein said bonding layer is an anodic bonding layer.

4. A lithographic apparatus according to claim 3, wherein said bonding layer comprises aluminium, and wherein said rigid layers comprise an alkali metal.

5. A lithographic apparatus according to claim 2, wherein said bonding layer forms an electrode of an electrostatic clamping electrode and one of said bonded layers forms a covering dielectric layer for clamping said article against said article support.

6. A lithographic apparatus according to claim 5, wherein said covering dielectric layer comprises a plurality of outward facing protrusions.

7. A lithographic apparatus according to claim 5, wherein a second bonding layer forms another electrode of an electrostatic clamping electrode for clamping said article support against a base plane provided by said lithographic apparatus.

8. A lithographic apparatus according to claim 7, wherein said second bonding layer is covered by a bonded layer comprising a plurality of outward facing protrusions.

9. A lithographic apparatus according to claim 1, wherein said bonded layers comprise a flat bonding surface.

10. A lithographic apparatus according to claim 1, wherein said bonded layers each comprise a rigid material.

11. A lithographic apparatus according to claim 10, wherein said rigid material comprises a material selected from the group consisting of: ceramic material, crystalline material, ULE®, ZERODUR®, Cordierite, and Sapphire material.

12. A lithographic apparatus according to claim 1, wherein at least a plurality of said recesses are interconnected and drain in a common drain.

13. A lithographic apparatus according to claim 12, wherein said common drain is arranged to communicate with a pressure environment provided in said lithographic apparatus.

14. A lithographic apparatus according to claim 13, wherein said pressure environment is a vacuum pressure environment or a backfill gas pressure environment.

15. An article support configured to support an article to be placed in a beam path of radiation of a lithographic apparatus, said article support comprising a plurality of bonded layers, wherein at least one of said bonded layers comprises a plurality of recesses facing another of said bonded layers so as to reduce a bonding surface therebetween.

16. An article support according to claim 15, wherein said article support is arranged to support a substrate to be processed into a manufacturing device, or a lithographic projection mask, or a mask handling apparatus, or a mask manufacturing apparatus, or an optical element.

17. A method of bonding objects of a rigid material for use in a lithographic apparatus, the method comprising:
providing a first object of a rigid material comprising a first face side;
providing a second object of a rigid material comprising a second face side;
creating a layout of recesses on at least said second face side of said second object so as to reduce a contact between said first object and said second object; and
bonding said first and said second objects by bonding said first and second face sides.

18. A method according to claim 17, wherein at least one of said objects is formed as a layer.

19. A method according to claim 18 wherein, after bonding, said at least one layer is machined to provide a thin layer bonded on the other of said at least one object.

20. A method according to claim 19, wherein said machining comprises polishing, or grinding, or chemical mechanical processing, or any combination thereof.

21. A method according to claim 17, wherein said bonding comprises anodic bonding.

22. A method according to claim 17, wherein said layout is arranged to provide a common drain for draining said recesses.

23. A method according to claim 22, further comprising draining said recesses, and sealing said recesses.

24. A method according to claim 23, wherein said rigid material comprises a material selected from the group consisting of: a ceramic material, a crystalline material, ULE®, ZERODUR®, Cordierite, and Sapphire material.

25. A bonding structure of bonded rigid materials for use in a lithographic apparatus, the bonding structure comprising:
a first object of a rigid material comprising a first face side;
a second object of a rigid material comprising a second face side, said second face side comprising protrusions formed thereon facing said first face side; and
a bonding material bonding said first and second face sides.

26. A bonding structure according to claim 25, wherein said bonding material is an aluminium material and/or said rigid material comprises alkali metals for anodic bonding said first and second objects.

27. A bonding structure according to claim 25, wherein said rigid material comprises a material selected from the group consisting of: ceramic material, crystalline material, ULE®, ZERODUR®, Cordierite, and Sapphire material.

28. A bonding structure according to claim 25, wherein at least one of said objects comprises layers.

29. A bonding structure according to claim 25, wherein said structure forms an article support configured to support an article to be placed in a beam path of the lithographic apparatus.

30. A bonding structure according to claim 29, wherein said structure forms a duct structure in said article support.

31. A bonding structure according to claim 25, wherein said structure forms a filler structure for housing a substrate in an immersion photolithographic apparatus.

32. A bonding structure according to claim 25, wherein said structure forms a suspension structure for suspending a sensor element or a mirror.

33. A bonding structure according to claim 25, wherein the protrusions have surfaces that are bonded to said first face side.

34. A device manufacturing method comprising:
generating a radiation beam;
supporting an article in a beam path of the radiation beam with an article support;
patterning the radiation beam; and
projecting the patterned radiation beam onto a target portion of a substrate,
wherein the article support comprises a plurality of bonded layers, at least one of said bonded layers comprising a plurality of recesses facing another of said bonded layers so as to reduce a bonding surface therebetween.

35. A device manufactured according to the method of claim 34.

* * * * *